US009203005B2

(12) United States Patent
Lee et al.

(10) Patent No.: US 9,203,005 B2
(45) Date of Patent: Dec. 1, 2015

(54) LIGHT-EMITTING DIODE (LED) PACKAGE HAVING FLIP-CHIP BONDING STRUCTURE

(71) Applicant: SAMSUNG ELECTRONICS CO., LTD., Suwon-si, Gyeonggi-do (KR)

(72) Inventors: Kun-jeong Lee, Suwon-si (KR); Young-jin Cho, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 16 days.

(21) Appl. No.: 14/197,889

(22) Filed: Mar. 5, 2014

(65) Prior Publication Data

US 2014/0252402 A1 Sep. 11, 2014

(30) Foreign Application Priority Data

Mar. 6, 2013 (KR) ........................ 10-2013-0023939

(51) Int. Cl.
*H01L 33/00* (2010.01)
*H01L 33/62* (2010.01)
*H01L 33/48* (2010.01)

(52) U.S. Cl.
CPC ............... *H01L 33/62* (2013.01); *H01L 33/486* (2013.01); *H01L 2224/13* (2013.01); *H01L 2224/16245* (2013.01)

(58) Field of Classification Search
CPC ......... H01L 33/52; H01L 33/54; H01L 33/60; H01L 33/62; H01L 33/405; H01L 33/644
USPC ............................................ 257/95, 98–100
See application file for complete search history.

(56) References Cited

U.S. PATENT DOCUMENTS

| | | | | |
|---|---|---|---|---|
| 7,390,129 | B2 | 6/2008 | Yonekubo et al. | |
| 2005/0274959 | A1 | 12/2005 | Kim et al. | |
| 2006/0192084 | A1* | 8/2006 | Lee et al. | 250/214.1 |
| 2012/0205697 | A1 | 8/2012 | Kim et al. | |
| 2013/0049053 | A1* | 2/2013 | Kususe et al. | 257/98 |

FOREIGN PATENT DOCUMENTS

| | | | |
|---|---|---|---|
| JP | 2004-119981 | A | 4/2004 |
| JP | 2005-039100 | A | 2/2005 |
| JP | 2011-035264 | A | 2/2011 |
| JP | 4643918 | B2 | 3/2011 |
| JP | 2011-151069 | A | 8/2011 |
| KR | 10-0601891 | B1 | 7/2006 |
| KR | 10-2012-0014420 | A | 2/2012 |
| KR | 10-2012-0064161 | A | 6/2012 |
| WO | 2012/039528 | A1 | 3/2012 |

* cited by examiner

*Primary Examiner* — Brook Kebede
(74) *Attorney, Agent, or Firm* — McDermott Will & Emery LLP

(57) ABSTRACT

A light-emitting diode (LED) package includes a package substrate, a first electrode pad, a second electrode pad, an upper insulating layer and an LED chip. The first electrode pad is disposed on an upper surface of the package substrate and includes a groove. The second electrode pad includes a protruding portion disposed in the groove of the first electrode pad. The upper insulating layer insulates the first electrode pad from the second electrode pad on the package substrate. The LED chip includes a first electrode and a second electrode which are respectively electrically connected in the form of a flip-chip to the first electrode pad and the protruding portion of the second electrode pad.

17 Claims, 18 Drawing Sheets

LIGHT-EMITTING DIODE (LED) PACKAGE HAVING FLIP-CHIP BONDING STRUCTURE

CROSS-REFERENCE TO RELATED APPLICATION

This application claims benefit of the priority of Korean Patent Application No. 10-2013-0023939, filed on Mar. 6, 2013, in the Korean Intellectual Property Office, the entire contents of which are hereby incorporated by reference.

TECHNICAL FIELD

The present inventive concept relates to a light-emitting diode (LED) package, and more particularly, to an LED package that has a flip-chip bonding structure.

BACKGROUND

The LED chip emits light as electrons and holes, which are injected into an active layer that is formed of a compound semiconductor, are combined. The LED chip can be packaged and used. When the LED chip in the LED package is operated, heat is generated, and thus, each element is thermally expanded. Accordingly, a thermal stress is exerted on an electrode or a pad in the LED chip. Therefore, there is a need for technology for developing a structure of the LED package for reducing a thermal stress.

SUMMARY

The present inventive concept provides a light-emitting (LED) package that has a flip-chip bonding structure which may reduce a thermal stress and has excellent workability.

An aspect of the present inventive concept relates to a light-emitting diode (LED) package including a package substrate, a first electrode pad disposed on an upper surface of the package substrate and including a groove, a second electrode pad including a protruding portion disposed in the groove of the first electrode pad, an upper insulating layer for insulating the first electrode pad from the second electrode pad on the package substrate, and an LED chip including a first electrode and a second electrode which are respectively electrically connected in the form of a flip-chip to the first electrode pad and the protruding portion of the second electrode pad.

The upper insulating layer may be disposed on a surrounding portion of the package substrate. The upper insulating layer may be disposed on a surrounding portion of the second electrode pad.

External electrode pads and a lower insulating layer may be disposed on a lower surface of the package substrate. The external electrode pads may be electrically connected to the first electrode pad and the second electrode pad and apply an electrical signal from outside of the LED package. The lower insulating layer may insulate the external electrode pads.

The package substrate may include metal.

The groove may be disposed in a plural number. The protruding portion may be disposed in a plural number. The groove may have a rectangular shape of which a width in one direction is greater than a width in another direction and the protruding portion may be a rod-type protruding member that is disposed in the rectangular groove.

A size of the first electrode pad may be greater than a size of the second electrode pad.

Another aspect of the present inventive concept encompasses a light-emitting diode (LED) package including a package substrate, a first electrode pad and a second electrode pad that are disposed on an upper surface of the package substrate and are insulated from each other by using an upper insulating layer, and an LED chip including a first electrode and a second electrode which are respectively electrically connected in the form of a flip-chip to the first electrode pad and the second electrode pad. The upper insulating layer is disposed in a lower part of the LED chip and buried inside the package substrate such that the upper insulating layer does not pass through the package substrate.

The upper insulating layer may be disposed on both sidewalls of the package substrate.

On a lower surface of the package substrate, a lower insulating layer may be disposed. The upper insulating layer may be connected to the lower insulating layer.

A lower insulating layer may be buried inside the package substrate from a lower surface of the package substrate. The lower insulating layer may be connected to the upper insulating layer at a location outside the LED chip.

An external electrode pad may be disposed on the lower surface of the package substrate, such that the external electrode pad is separated by the lower insulating layer. The external electrode pad may be electrically connected to the first electrode pad and the second electrode pad to apply an electrical signal from outside of the LED chip.

A still another aspect of the present inventive concept relates to a light-emitting diode (LED) package including a package substrate, a first electrode pad disposed on an upper surface of the package substrate, a second electrode pad, an upper insulating layer for insulating the first electrode pad from the second electrode pad on the package substrate, and an LED chip including a first electrode and a second electrode which are respectively electrically connected in the form of a flip-chip to the first electrode pad and the second electrode pad. A portion of the upper insulating layer is placed between the first electrode pad and the second electrode pad. The second electrode extends in a direction perpendicular to an extending direction of the portion of the upper insulating layer between the first electrode pad and the second electrode pad.

The second electrode may have a rectangular shape, and a long edge of the second electrode may be perpendicular to the extending direction of the portion of the upper insulating layer between the first electrode pad and the second electrode pad.

BRIEF DESCRIPTION OF THE DRAWINGS

The foregoing and other features of the present inventive concept will be apparent from more particular description of embodiments of the present inventive concept, as illustrated in the accompanying drawings in which like reference characters may refer to the same or similar parts throughout the different views. The drawings are not necessarily to scale, emphasis instead being placed upon illustrating the principles of the embodiments of the present inventive concept.

DETAILED DESCRIPTION

Figure 1:
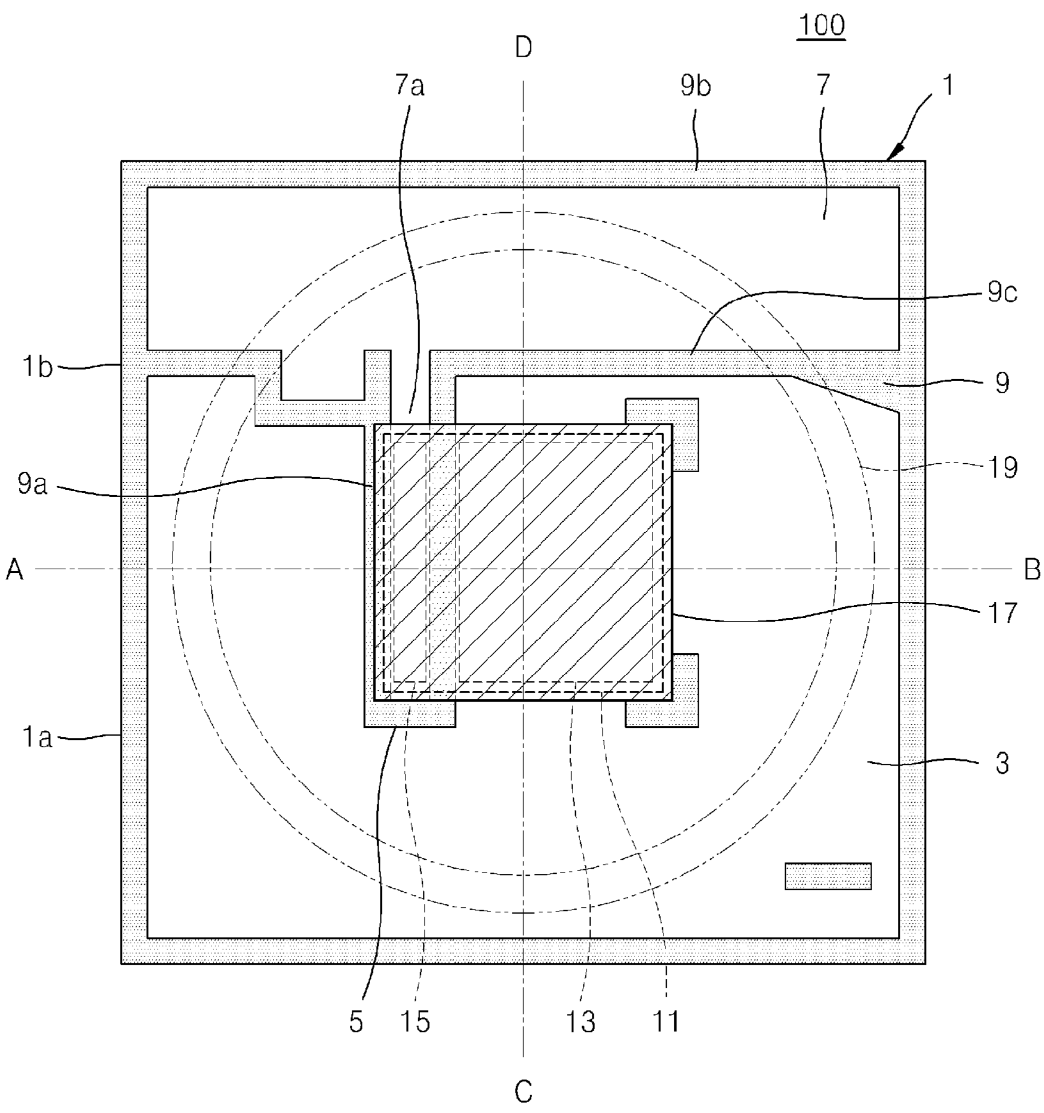
FIGS. 1 through 4 are diagrams illustrating a light-emitting diode (LED) package according to an embodiment of the present inventive concept.

Hereinafter, the present inventive concept will be described more fully with reference to the accompanying drawings, in which exemplary embodiments of the present inventive concept are shown. Like reference numerals in the drawings denote like elements, and thus their description will be omitted.

The embodiments of the present inventive concept are provided so that the present inventive concept is fully explained to those skilled in the art. The present inventive concept may, however, be embodied in many different forms and should not be construed as being limited to the embodiments set forth herein; rather, these embodiments are provided so that this disclosure will be thorough and complete, and will fully convey the present inventive concept to those skilled in the art.

It will be understood that, although the terms first, second, etc. may be used herein to describe various members, components, regions, layers, sections, and/or elements, these members, parts, regions, layers, sections, and/or elements should not be limited by these terms. These terms do not refer to a particular order, rank, or superiority, and are only used to distinguish one member, component, region, layer, section, or element from another member, component, region, layer, section, or element. Thus, a first member, component, region, layer, section, or element discussed below could be termed a second member, component, region, layer, section, or element without departing from the teachings of the example embodiments. For example, a first element may be referred to as a second element, and similarly, a second element may be referred to as a first element without departing from the scope of protection.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when an exemplary embodiment can be differently implemented, a function or an operation specified in a particular process may be performed differently from an order specified in a flowchart. For example, two continuous processes may be substantially simultaneously performed, or processes may be performed in a reverse order according to a related function or operation.

In the drawings, for example, illustrated shapes may be deformed according to fabrication technology and/or tolerances. Therefore, the exemplary embodiments are not limited to certain shapes illustrated in the present specification, and may include modifications of shapes caused in fabrication processes. The embodiments herein may be implemented in a specific form, or combined in various ways.

Hereinafter, a structure of a light-emitting diode (LED) package, according to an embodiment of the present inventive concept, is described.

FIGS. 1 through 4 are diagrams illustrating an LED package 100 according to an embodiment of the present inventive concept.

Figure 2:
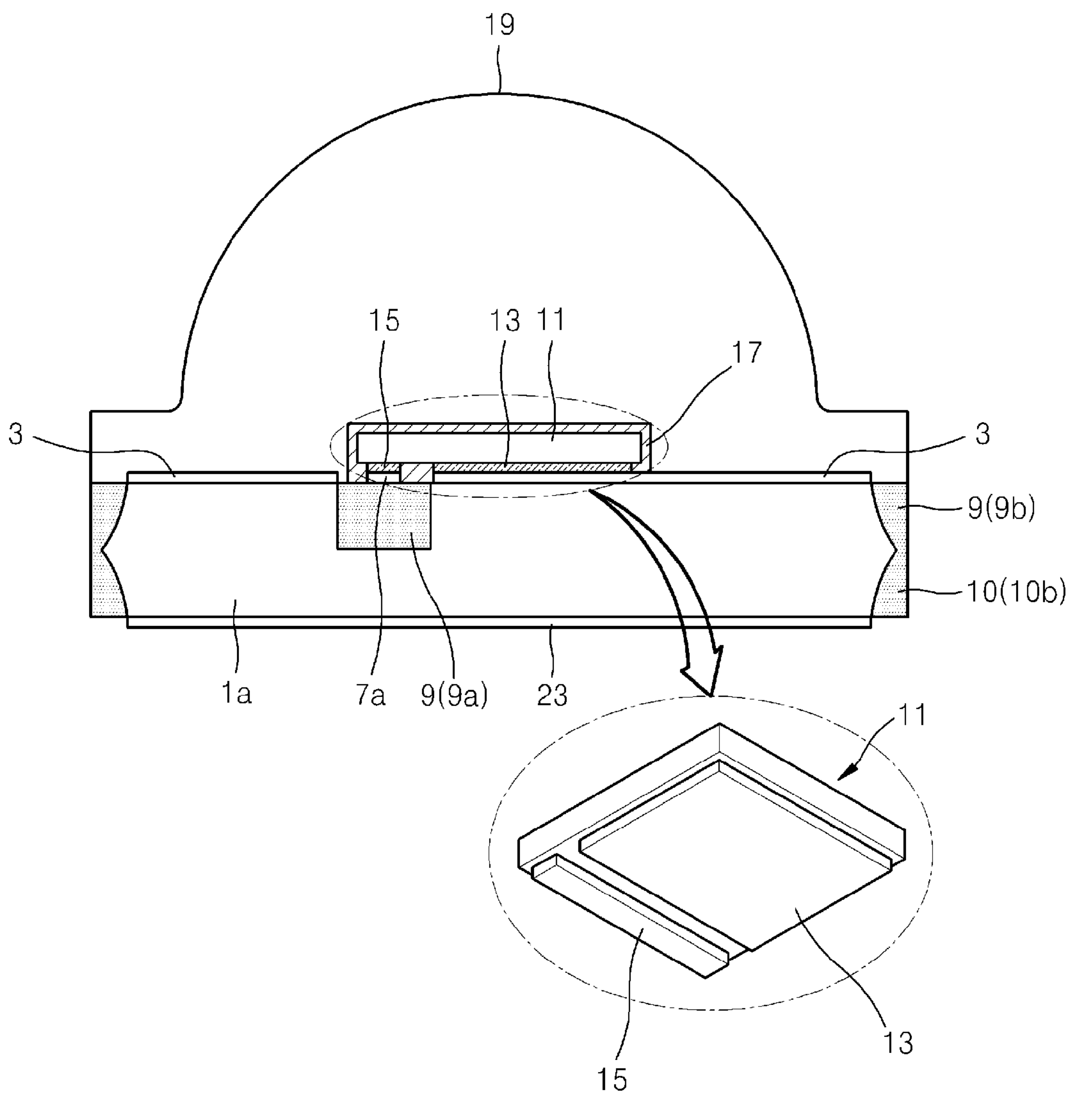
Figure 3:
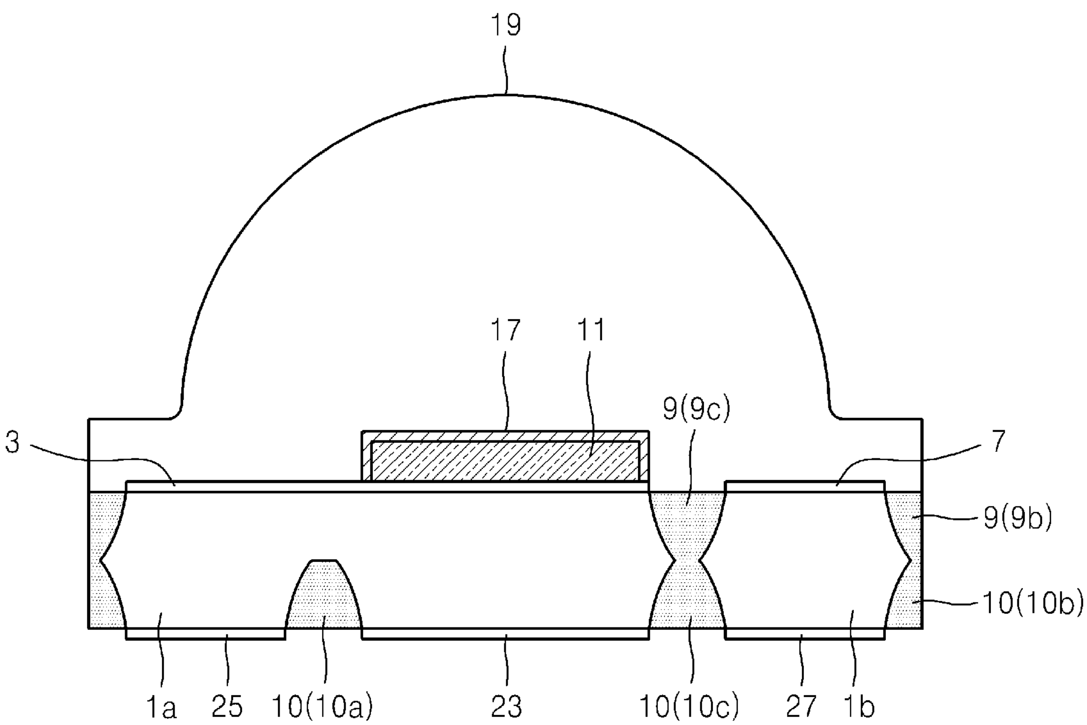
Figure 4:
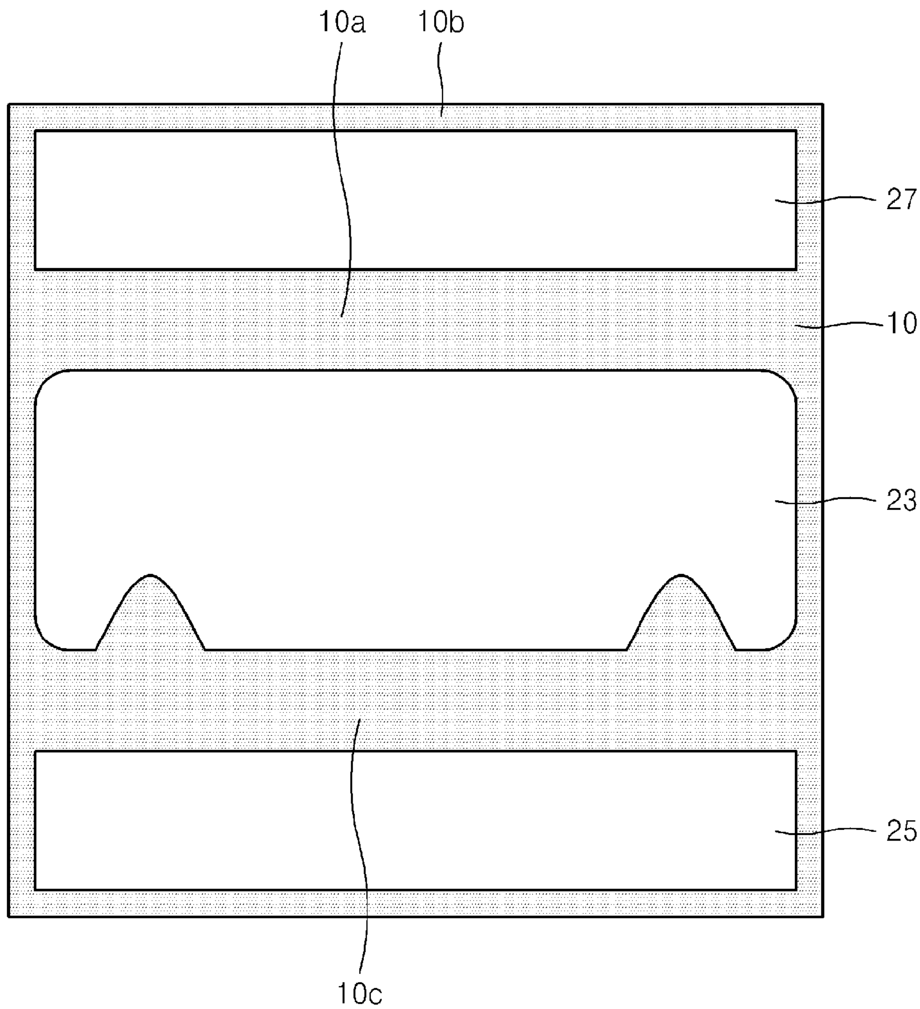

Specifically, FIGS. 1 and 4 are respectively upper and lower plan views of the LED package 100. FIGS. 2 and 3 are cross-sectional views of the LED package 100 which are respectively taken along lines A-B of FIG. 1 and C-D of FIG. 1.

The LED package 100 may include a package substrate 1. The package substrate 1 may be formed of metal, ceramic, silicon, a silicon alloy, or a polymer material. An example of ceramic may include aluminium nitride (AlN), or aluminum oxide ($Al_2O_3$). An example of a silicon alloy may include silicon-aluminum (Si—Al) or silicon carbide (SiC). An example of a polymer material may include polyimide. The package substrate 1 may be formed of a material that effectively reflects light, or may be formed to have a color, for example, white or silver so that a surface of the package substrate 1 may effectively reflect light. If the package substrate 1 is formed of metal, package workability thereof may be improved.

An intermediate layer (not separately illustrated) may be formed between an upper surface of the package substrate 100 and first and second electrode pads 3 and 7. The intermediate layer may be provided to form the first and second electrode pads 3 and 7, regardless of a material of the package substrate 100.

The package substrate 1 may be formed of any material that forms a lead frame. The package substrate 1 in an embodiment of the present inventive concept may be formed of copper (Cu). The package substrate 1 may be divided into a first area 1*a* and a second area 1*b*. However, the package substrate 1 may also be formed as one element. An upper insulating layer 9 and a lower insulating layer 10 that provide insulating performance, as to be described later, may be buried in the package substrate 1.

The first electrode pad 3 may be disposed and formed on an upper surface of the first area 1*a* of the package substrate 1. The first electrode pad 3 may include a groove 5. The groove 5 may be formed inside a body of the first electrode pad 3. The groove 5 may have a rectangular shape of which a width in one direction is greater than a width in another direction. The first electrode pad 3 may be formed of a metal pattern, for example, a copper pattern.

The first electrode pad 3 may be formed of gold (Au), tin (Sn), plumbum (Pb), silver (Ag), indium (In), germanium (Ge), nickel (Ni), Si, or a combination thereof. The first electrode pad 3 may also formed of an Au—Sn alloy, a Pb—Ag—In alloy, a Pb—Ag—Sn alloy, a Pb—Sn alloy, an Au—Ge alloy, an Au—Si alloy, or Au. The first electrode pad 3 may be a thin-film electrode pad that is obtained by forming and then patterning a plating layer on the first area 1*a* of the package substrate 1.

The second electrode pad 7 may be disposed to be separate from the first electrode pad 3. The second electrode pad 7 may include a protruding portion 7*a* that is disposed inside the groove 5 in the first electrode pad 3. The protruding portion 7*a* may be a rod-type protruding member that is disposed in the rectangular-type groove 5. The second electrode pad 7 may be formed of the same material as the first electrode pad 3. The second electrode pad 7 may be a thin-film electrode pad that is obtained by forming and then patterning a plating layer on the second area 1*b* of the package substrate 1. The first electrode pad 3 and the second electrode pad 7 may be formed of a material that effectively reflects light, or formed to have a color, for example, white or silver so that a surface of the package substrate 1 may effectively reflect light. A size of the first electrode pad 3 may be greater than a size of the second electrode pad 7.

On an upper surface of the package substrate 1, an upper insulating layer 9 for insulating the first electrode pad 3 from the second electrode pad 7 may be formed. The first electrode pad 3 and the second electrode pad 7 may be insulated from each other by using the upper insulating layer 9. The upper insulating layer 9 may be formed of an insulating resin, for example, epoxy resin.

The upper insulating layer 9 may include an upper insulating layer 9*a* that may be formed on a surrounding portion of the second electrode pad 7 that includes the protruding portion 7*a*. The upper insulating layer 9 may include an upper insulating layer 9*b* that may be formed on a surrounding portion of the package substrate 1. The upper insulating layer 9 may include an upper insulating layer 9*c* that may be formed on a separation portion between the first electrode pad 3 and the second electrode pad 7.

On the first electrode pad 3 and the second electrode pad 7 included in the package substrate 1, an LED chip 11 may be disposed in the form of a flip-chip. A first electrode 13 and a second electrode 15, included in the LED chip 11, may be respectively connected in the form of a flip-chip to the first electrode pad 3 and the protruding portion 7*a* that is included in the second electrode pad 7. The first electrode 13 may be an anode electrode. The second electrode 15 may be a cathode electrode.

The LED chip 11 may be a horizontal-type LED chip. As illustrated in FIG. 2, the LED chip 11 may be electrically connected to the first electrode pad 3 and the second electrode pad 7, with the first electrode 13 and the second electrode 15 facing downwards. The LED chip 11 may be a blue LED chip that emits blue light. The LED chip 11 may be an LED chip that emits light of a different color, for example, red, yellow, or blue.

As illustrated in FIG. 2, the upper insulating layer 9*a*, which is located below the LED chip 11, may be buried inside the first area 1*a* of the package substrate 1, so as not to pass through the first area 1*a* of the package substrate 1. Referring to FIGS. 3 and 4, the lower insulating layer 10 may include a lower insulating layer 10*a* which is not connected to an upper insulating layer. The lower insulating layer 10 may include an upper insulating layer 9*b* that may be formed on both sidewalls of the package substrate 1. As illustrated in FIGS. 2 through 4, the lower insulating layer 10 may be formed on a lower surface of the package substrate 1. The upper insulating layer 9*b*, which is formed on both sidewalls of the package substrate 1, may be connected to the lower insulating layer 10*b*.

As illustrated in FIGS. 2 and 3, the lower insulating layer 10 may be buried inside the package substrate 1 from the lower surface of the package substrate 1. As illustrated in FIG. 3, the lower insulating layer 10 may include a lower insulating layer 10*c*. The lower insulating layer 10*c* may be disposed inside the package substrate 1 and, may be connected to the upper insulating layer 9*c* outside the LED chip 11. Like the upper insulating layer 9, the lower insulating layer 10 may formed of an insulating resin, for example, epoxy resin.

A fluorescent layer 17 may be formed on the LED chip 11. As illustrated in FIGS. 2 and 3, the fluorescent layer 17 may be formed to cover an entire surface of the LED chip 11, other than the first electrode 13 and the second electrode 15.

The fluorescent layer 17 may be formed by distributing a fluorescent material throughout a light-transmitting resin such as silicon resin or epoxy resin. If the LED chip 11 is a blue LED chip, a fluorescent body, which is included in a light-emitting resin, may include at least one from among garnets such as yttrium aluminum garnet (YAG) or terbium aluminum garnet (TAG), silicates, nitrides, or oxynitrides. A lens 19 may be formed on the fluorescent layer 17.

As illustrated in FIG. 4, a plurality of external electrode pads 23, 25 and 27 may be formed on a lower surface of the package substrate 1. The external electrode pads are electrically connected to the first electrode pad 3 and the second electrode pad 7 and may apply an electrical signal from the outside. The lower insulating layer 10 for insulating the external electrode pads 23, 25, and 27 may be formed between the external electrode pads 23, 25, and 27. As illustrated in FIG. 3, the external electrode pads 23 and 25 may be electrically connected to the first electrode pad 3. As illustrated in FIG. 3, the external electrode pads 27 may be electrically connected to the second electrode pad 7.

Then, a thermal stress, which is exerted on an LED chip due to thermal expansion of elements of an LED chip that has the configuration as provided above, is described.

Figure 5:
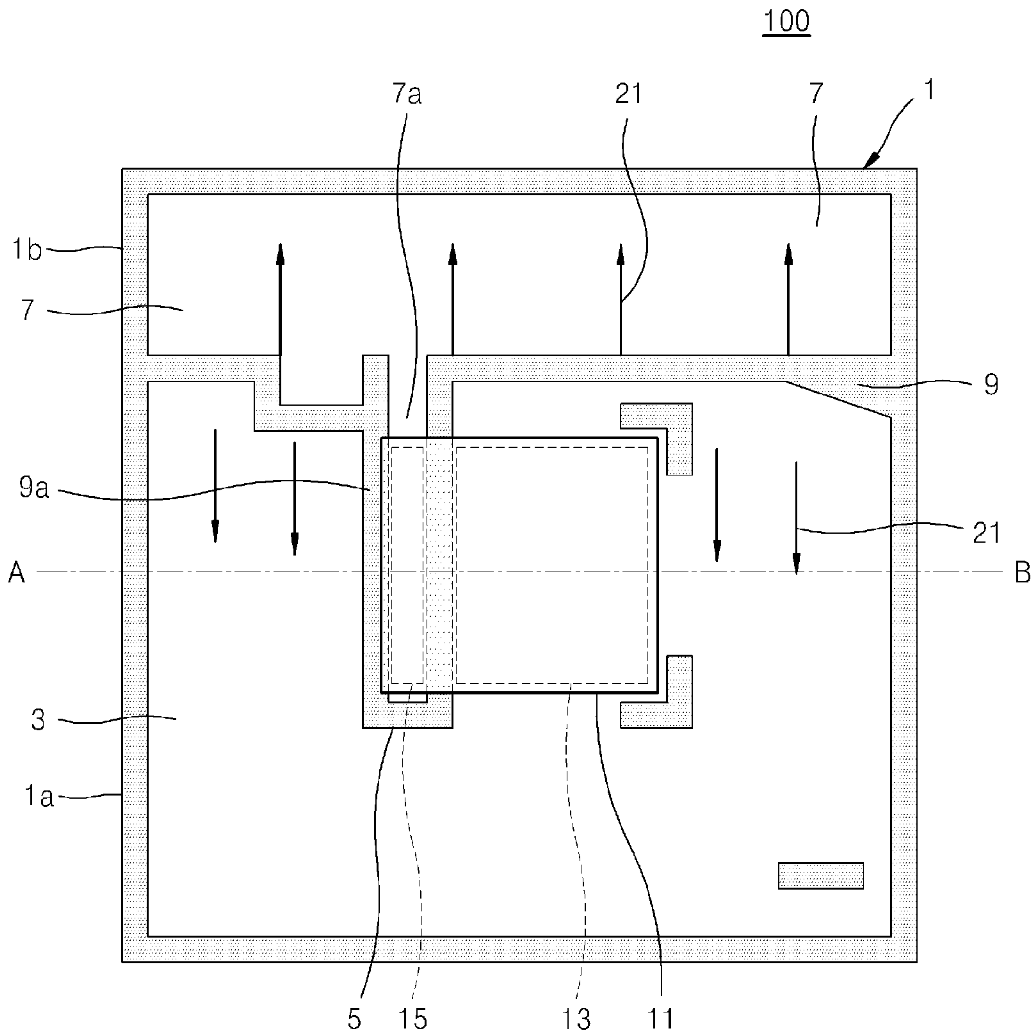
FIGS. 5 and 6 are diagrams for explaining a thermal stress on an LED chip, which is caused by thermal expansion of the LED package of FIG. 1.
Figure 6:
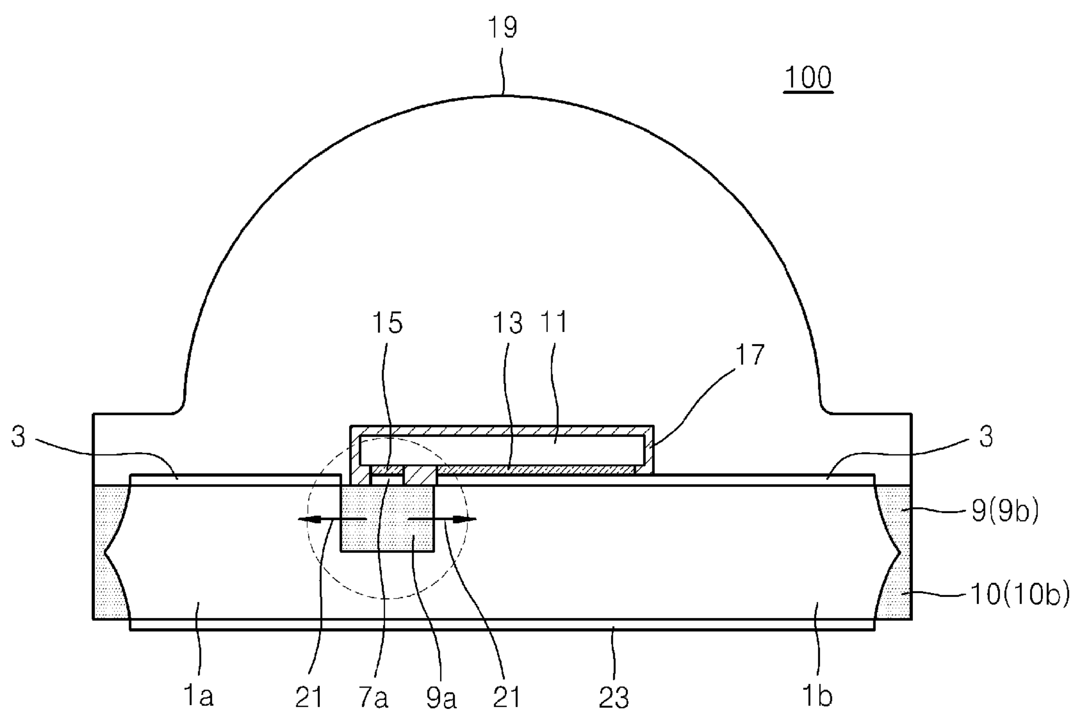
Figure 7:
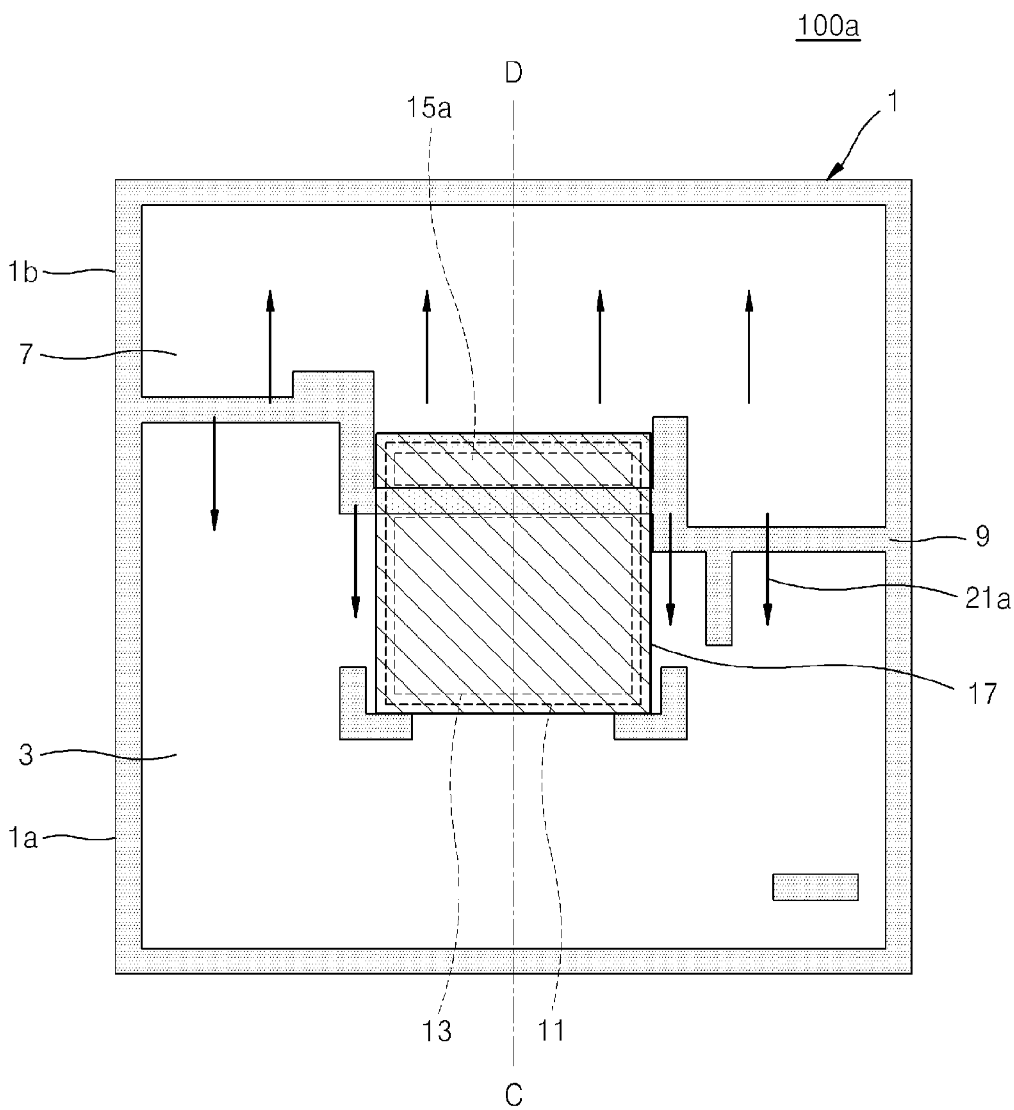
FIGS. 7 and 8 are diagrams for explaining a comparative example for comparing FIG. 5 to FIG. 6.
Figure 8:
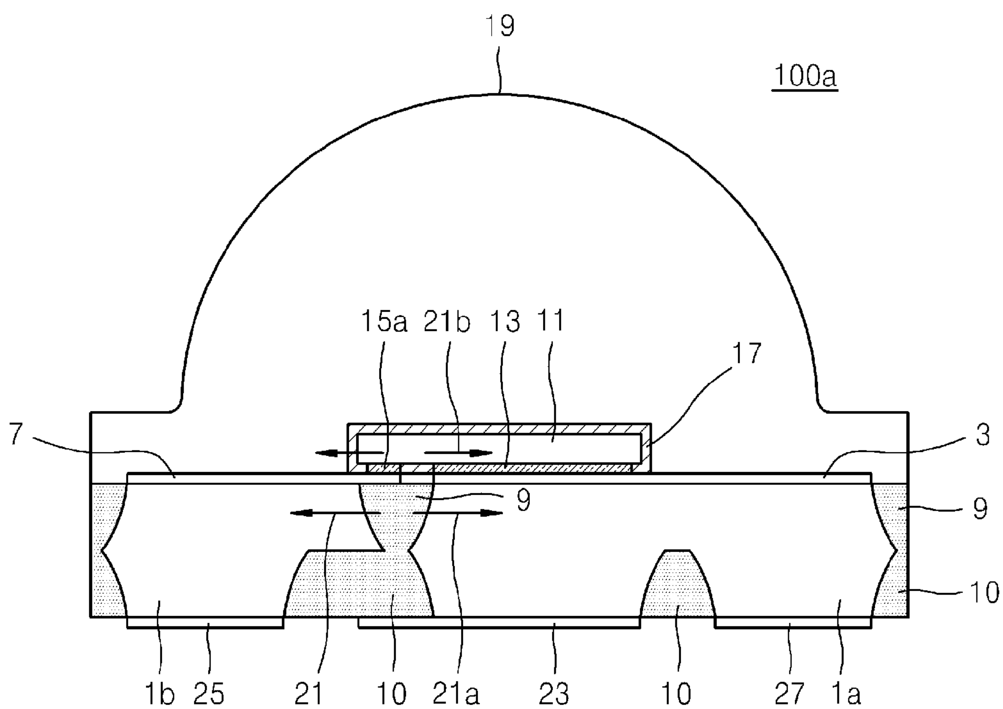

FIGS. 5 and 6 are diagrams for explaining a thermal stress on an LED chip, which is caused by thermal expansion of the LED package of FIG. 1. FIGS. 7 and 8 are diagrams for explaining a comparative example for comparing FIG. 5 to FIG. 6

Specifically, FIG. 5 is a plan view illustrating the LED package 100 of FIG. 1, other than the fluorescent layer 17 and the lens 19. FIG. 6 is a cross-sectional view of an LED package 100, which is taken along a line A-B of FIG. 5. FIG. 7 is a plan view illustrating the LED package 100*a* for comparing to the LED package 100 of FIG. 5. FIG. 8 is a cross-sectional view of the LED package 100*a*, which is taken along a line C-D of FIG. 7.

As described above, with reference to the LED package 100 of FIGS. 5 and 6, the upper insulating layer 9 and the protruding portion 7*a*, which is included in the second electrode pad 7, may be disposed inside the groove 5 in the first electrode pad 3 on the package substrate 1. Additionally, the LED chip 11, which includes the first electrode 13 and the second electrode 15 respectively on the first electrode pad 3 and the protruding portion 7*a* in the second electrode pad 7, may be attached in the form of a flip-chip to the package substrate 1. Particularly, with reference to the LED package 100, the second electrode 15 included in the LED chip 11 may be located vertically (i.e., extending in a top-bottom direction as illustrated in FIG. 5) perpendicular to an extending direction of the upper insulating layer 9 which is placed between the first electrode pad 3 and the second electrode pad 7. The LED package 100 may include the lower insulating layer 10 that is buried inside the package substrate 1 from a lower surface of the package substrate 1 and electrically separates from the external electrode pad 23.

If the upper insulating layer 9 is formed of epoxy resin, a coefficient of thermal expansion (CTE) is 30-70 ppm/° C. If the package substrates 1 (in areas 1*a* and 1*b*), the electrode pads 3 and 7, and the electrodes 13 and 15 are formed of copper, a CTE is 16-17 ppm/° C. A CTE of a gallium nitride (GaN) layer, which is an element of the LED chip 11, is 3-6 ppm/° C. Accordingly, as illustrated in FIGS. 5 and 6, if heat is generated from the LED chip 11, the upper insulating layer 9 may be thermally expanded. Thus, a thermal expansion force 21 may affect the LED chip 11.

However, as indicated by an arrow that is shown in FIG. 5, with regard to the LED package 100, the thermal expansion force 21 of the upper insulating layer 9 may be applied to a short edge (that has a short width or length) of the second electrode 15, rather than a long edge (that has a long width or length) of the second electrode 15. Thus, a thermal stress may not be exerted on the LED chip 11 or may be minimally exerted on the LED chip 11.

Additionally, with regard to the LED package 100 which is shown in FIG. 6, the upper insulating layer 9 may be connected to the lower insulating layer 10, but not in an area underneath the LED chip 11. Accordingly, the thermal expansion force 21 may not be transmitted to the outside of the LED chip 11, and thus a thermal stress may not be exerted on the LED chip 11 or may be minimally exerted on the LED chip 11.

On the contrary, with regard to the LED package 100*a*, that is shown in FIGS. 7 and 8, the first electrode pad 3 and the second electrode 7, which are insulated by the upper insulating layer 9 on the package substrate 1, are disposed. Additionally, the LED chip 11, which includes the first electrode 13 and a second electrode 15*a* respectively on the first electrode pad 3 and the second electrode pad 7, is attached in the form of a flip-chip to the package substrate 1. Particularly, with regard to the LED package 100*a*, the second electrode 15*a* included in the LED chip 11 is located horizontally (i.e., extending in a left-right direction as illustrated in FIG. 7), compared to an extending direction of the upper insulating layer 9 which is placed between the first electrode pad 3 and the second electrode pad 7.

Accordingly, as illustrated in FIGS. 7 and 8, if heat is generated from the LED chip 11, the upper insulating layer 9 is thermally expanded. Thus, a thermal expansion force 21*a* affects the LED chip 11.

However, unlike the LED package 100 that is shown in FIGS. 5 and 6, in the case of the LED package 100*a* that is shown in FIGS. 7 and 8, the thermal expansion force 21*a* of the upper insulating layer 9 is applied to a long edge (that has a long width or length) of the second electrode 15, rather than a short edge (that has a short width or length) of the second electrode 15. Accordingly, the LED chip 11 is thermally expanded as indicated by a reference numeral 21*b*, and thus, a thermal stress on the LED chip 11 may be increased in comparison to the example of FIGS. 5 and 6.

Additionally, with regard to the LED package 100*a* which is shown in FIGS. 7 and 8, the upper insulating layer 9 is connected to the lower insulating layer 10, beneath the LED chip 11. Accordingly, the thermal expansion force 21*a* is transmitted to the outside of the LED chip 11, and thus a thermal stress on the LED chip 11 may be increased in comparison to the example of FIGS. 5 and 6.

FIGS. 9A through 9I are cross-sectional views for explaining a method of manufacturing the LED package, according to an embodiment of the present inventive concept. FIGS. 10 through 13 are plan views illustrating some processes included in the method of FIGS. 9A through 9I.

Figure 9A:
FIGS. 9A through 9I are cross-sectional views for explaining a method of manufacturing the LED package, according to an embodiment of the present inventive concept.
Figure 9B:
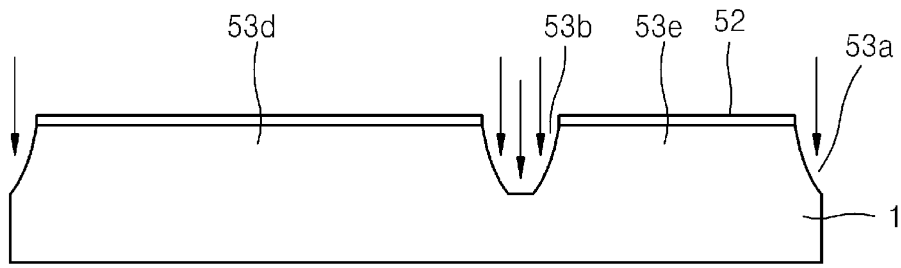
Figure 10:
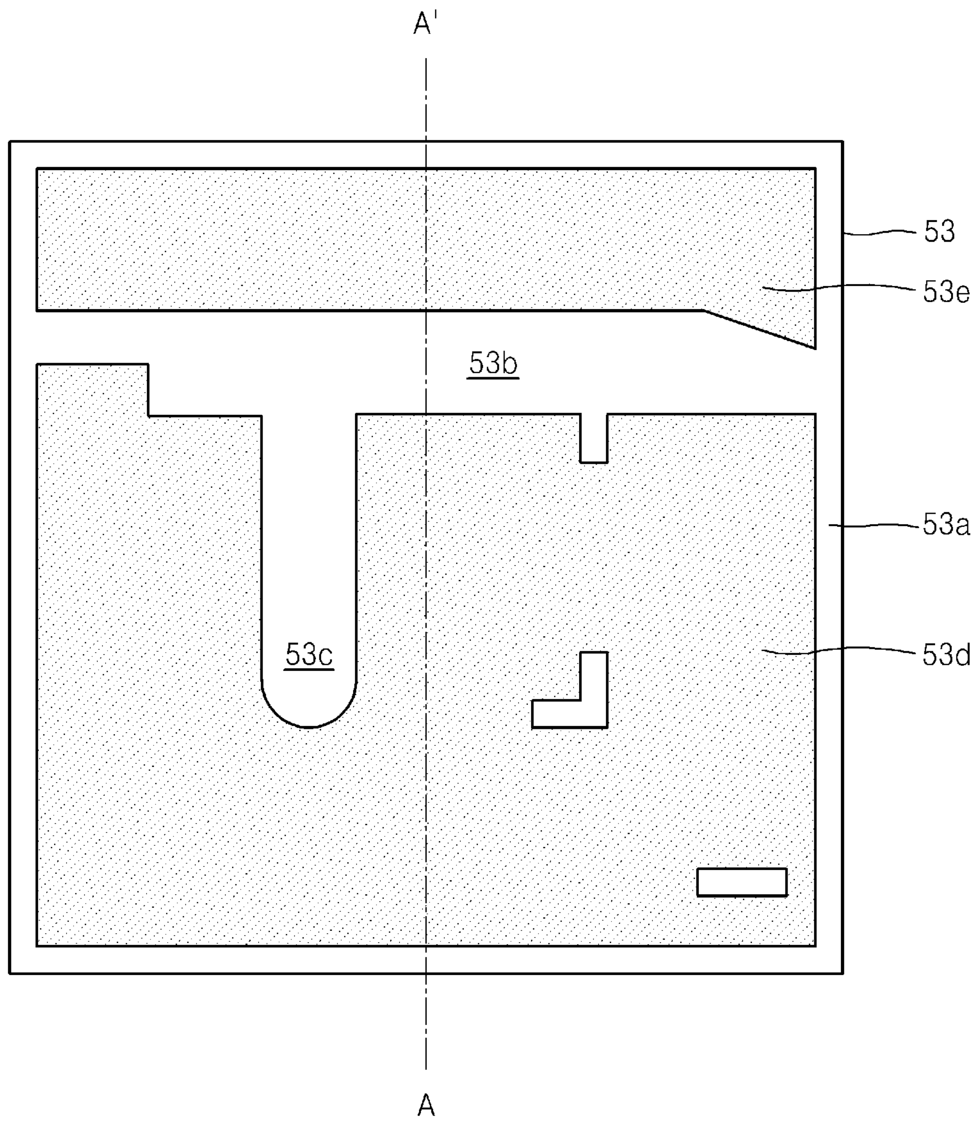
FIGS. 10 through 13 are plan views illustrating some processes included in the method of FIGS. 9A through 9I.

Referring to FIGS. 9A, 9B, and 10, the package substrate 1 may be prepared as shown in FIG. 9A. As described above, the package substrate 1 may be formed of metal. In an embodiment of the present inventive concept, a copper substrate may be used as the package substrate 1.

Then, as shown in FIG. 9B, an upper mask pattern 52 may be formed on an upper surface of the package substrate 1. Then, a part of the upper surface of the package substrate 1 may be etched, and thus, an upper substrate pattern 53, as shown in FIG. 10, may be formed. A plan view of the upper substrate pattern 53 is illustrated in FIG. 10. A cross-section of the package substrate 1, which is taken along a line A-A' in FIG. 10, is shown in FIG. 9B. Upper substrate patterns 53*a* through 53*e* illustrated in FIG. 10 correspond to upper substrate patterns 53*a* through 53*e* illustrated in FIG. 9B. The upper substrate patterns 53 may include the pattern 53*a* that is located around an upper surface of the package substrate 1, the pattern 53*c* that is located inside the upper surface of the package substrate 1, and the pattern 53*b* that is located between the two inside patterns 53*d* and 53*e*. The patterns 53*a*, 53*b* and 53*c* may be a groove pattern that is grooved inside the package substrate 1.

Figure 9C:
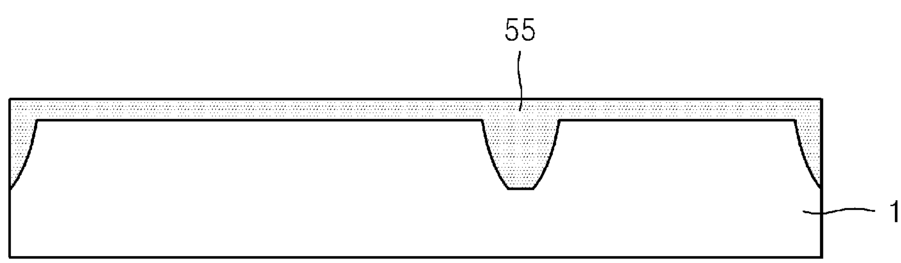
Figure 9D:
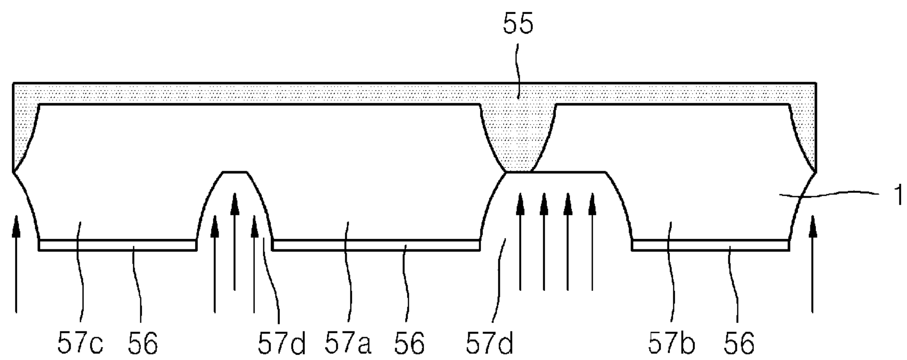

Referring to FIGS. 9C and 9D, the upper mask pattern 53 may be removed. Then, as illustrated in FIG. 9C, a first insulating layer 55 may be formed on an upper surface of the package substrate 1. The first insulating layer 55 may be formed of epoxy resin. The first insulating layer 55 may be formed on the upper substrate pattern 53 included in the package substrate 1. The first insulating layer 55 may be formed to fill the inside of the groove patterns 53*a*, 53*b* and 53*c* that constitute the upper substrate pattern 53.

Figure 11:
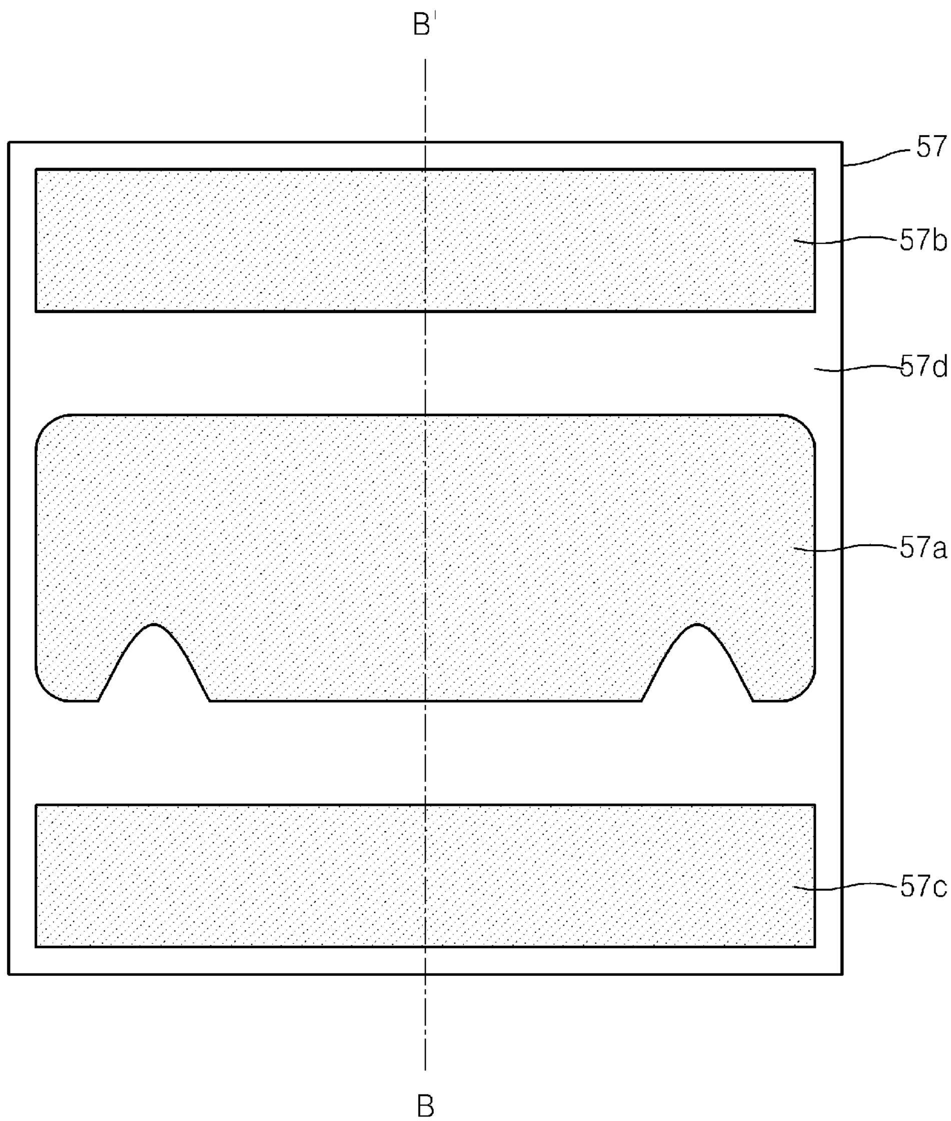

Then, as shown in FIG. 9D, a lower mask pattern 56 may be formed on the lower surface of the package substrate 1. Then, a part of a lower surface of the package substrate 1 may be etched, and thus, a lower substrate pattern 57, as shown in FIG. 11, may be formed. A plan view of the lower substrate pattern 57 is illustrated in FIG. 11. A cross-section of the package substrate 1, which is taken along a line B-B' in FIG. 11, is shown in FIG. 9D. Lower substrate patterns 57*a*, 57*b*, 57*c* and 57*d* illustrated in FIG. 11 correspond to lower substrate patterns 57*a*, 57*b*, 57*c* and 57*d* illustrated in FIG. 9D. The lower substrate pattern 57*d* may be a groove pattern that is formed inside the package substrate 1.

Figure 9E:
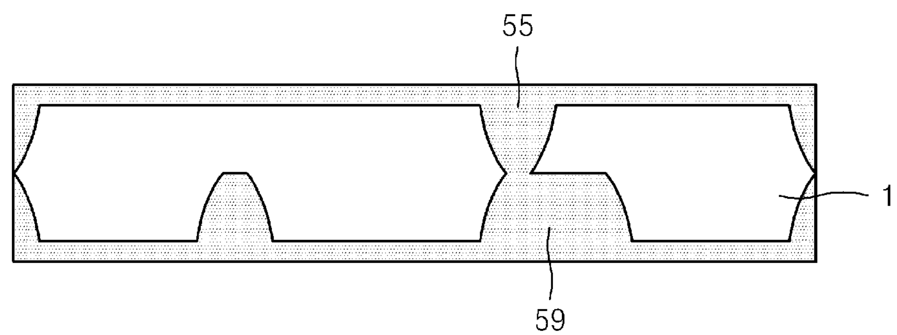
Figure 9F:
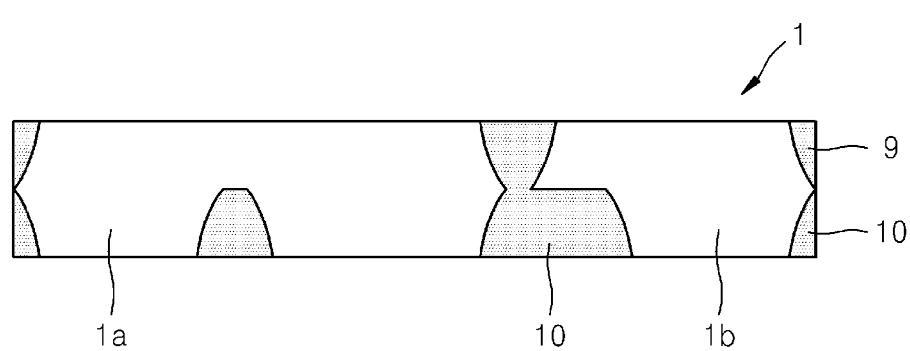

Referring to FIGS. 9E and 9F, the lower mask pattern 56 may be removed. Then, as illustrated in FIG. 9E, a second insulating layer 59 may be formed on a lower surface of the package substrate 1. The second insulating layer 59 may be formed of epoxy resin. The second insulating layer 59 may be formed on the lower substrate pattern 57 included in the package substrate 1. The second insulating layer 59 may be formed to fill the inside of the groove pattern 57*d* that constitutes the lower substrate pattern 57.

Then, as illustrated in FIG. 9E, the first insulating layer 55 and the second insulating layer 59 may be planarized on an upper surface and a lower surface of the package substrate 1. Then, the first insulating layer 55 may become the upper insulating layer 9. The second insulating layer 59 may become the lower insulating layer 10. The upper insulating layer 9 and the lower insulating layer 10, which are formed on both sidewalls of the package substrate 1, may be connected with each other. The upper insulating layer 9 and the lower insulating layer 10 may be also connected with each other in a partial area inside the package substrate 1. Resultantly, the package substrate 1 may be separated into the first area 1*a* and the second area 1*b*, such that the first area 1*a* and the second area 1*b* are insulated from each other.

Figure 9G:
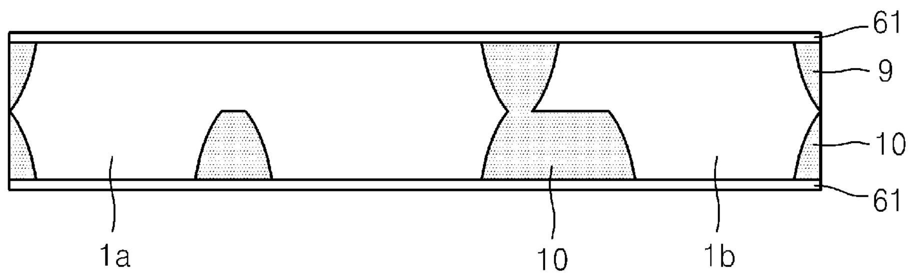

Referring to FIGS. 9G, 9H, 12, and 13, as illustrated in FIG. 9G, a conductive layer 61 may be formed on upper and lower surfaces of the package substrate 1. The conductive layer 61 may be a conductive layer that is formed by plating the upper and lower surfaces of the package substrate 1. The conductive layer 61 may be formed as a copper layer.

Figure 9H:
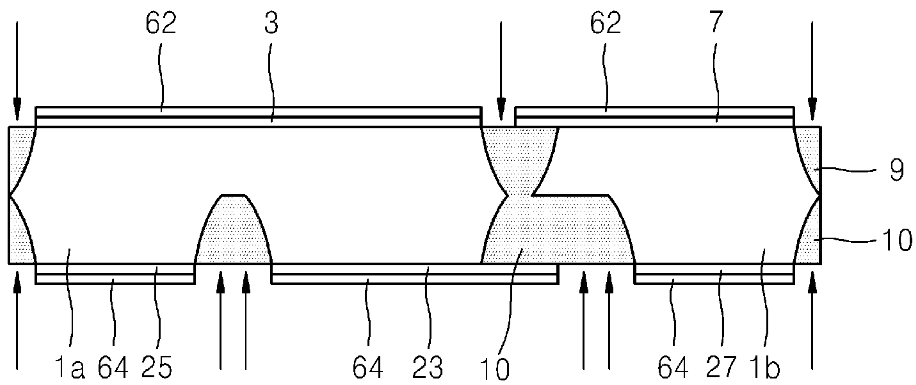
Figure 12:
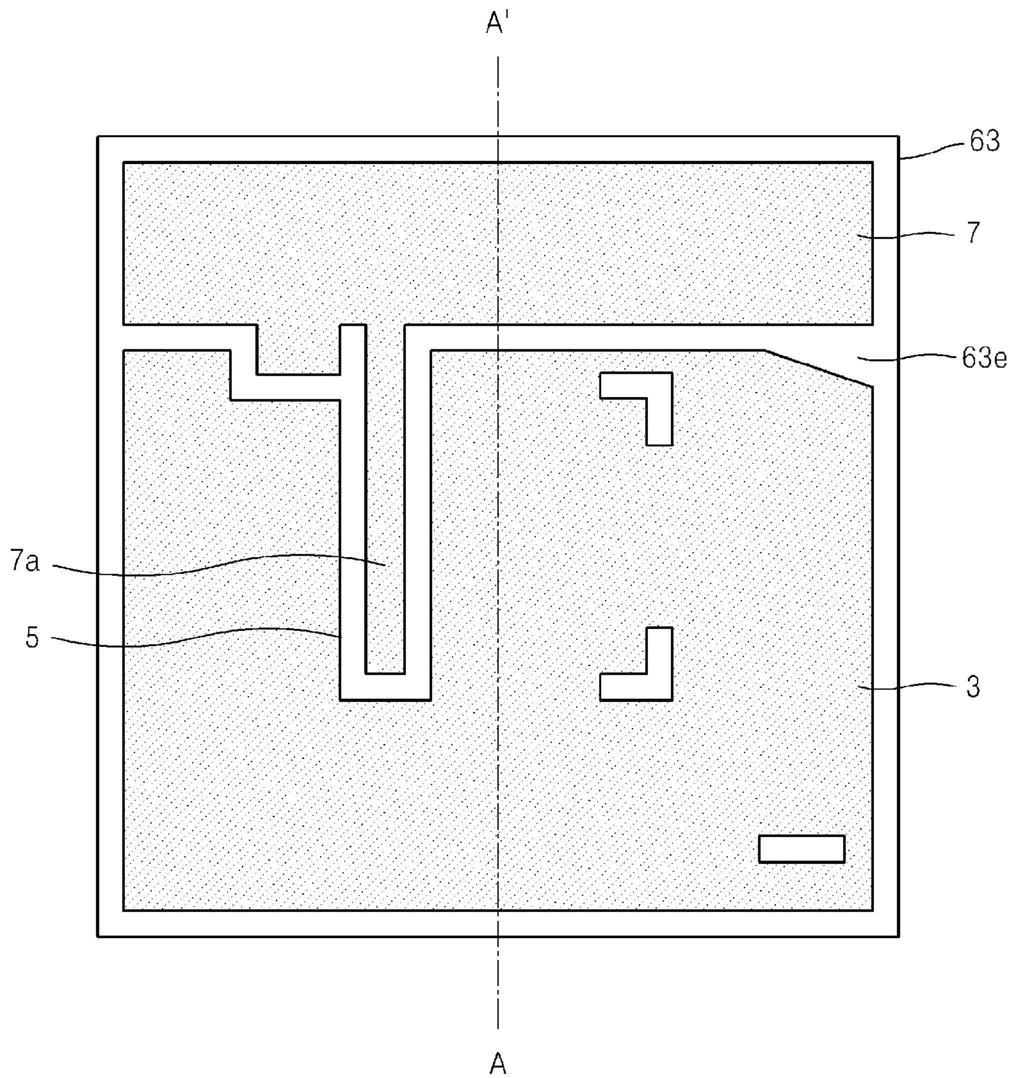

Then, as shown in FIG. 9H, an upper mask pattern 62 may be formed on the conductive layer 61 of in FIG. 9G, which is formed on an upper surface of the package substrate 1. Then, the conductive layer 61 may be etched by using the upper mask pattern 62 as an etching mask, and thus, as illustrated in FIG. 12, an electrode pad 63 may be formed. A plan view of the electrode pad 63 is illustrated in FIG. 12. A cross-section of the package substrate 1, which is taken along a line A-A' in FIG. 12, is shown in FIG. 9H. Electrode pad 63 of FIG. 12 corresponds to the electrode pads 3 and 7 of FIG. 9H. As described above, the electrode pad 63 may include the first electrode pad 3 that includes the groove 5, and the second electrode pad 7 that includes the protruding portion 7*a* which is disposed in the groove 5 included in the first electrode 3. Referring to FIG. 12, an upper insulating layer 63*e* may be formed for insulating the first electrode pad 3 and the second electrode pad 7.

Figure 13:
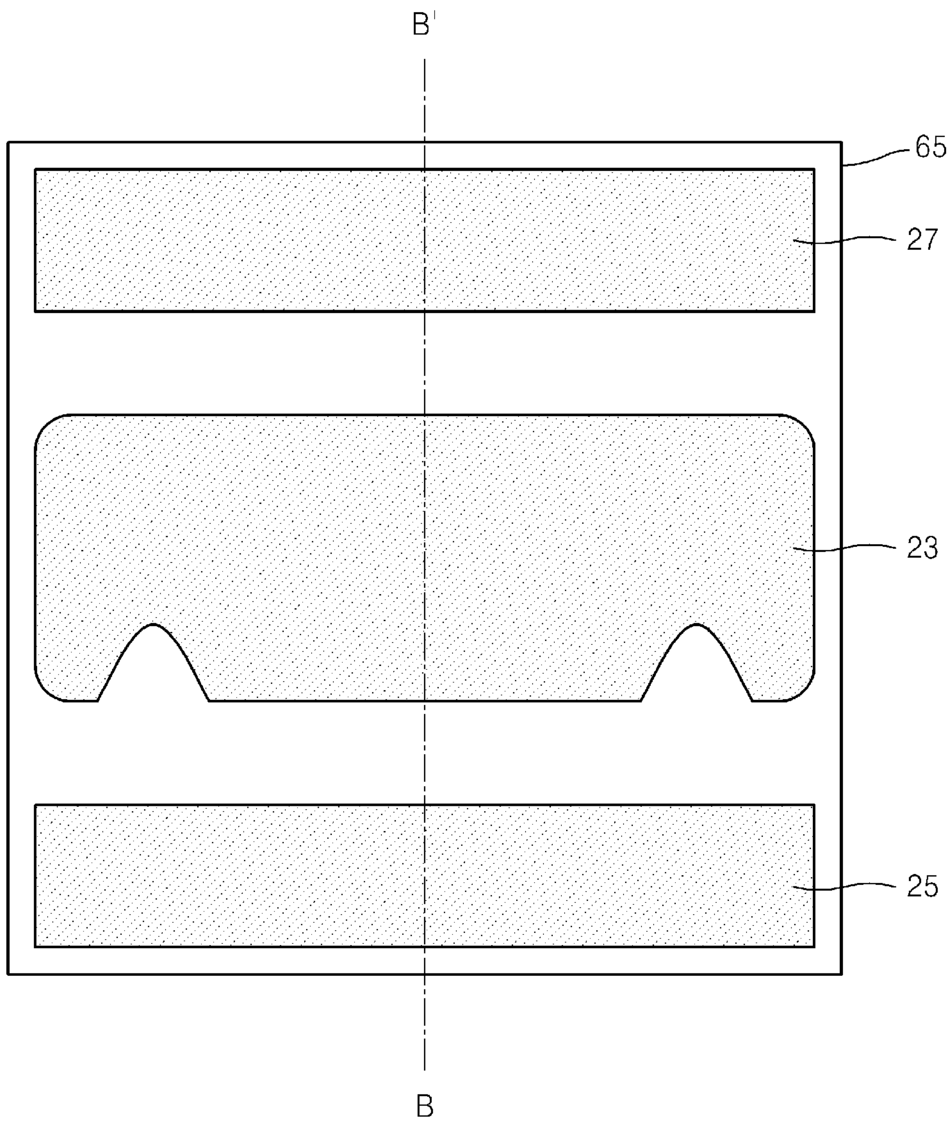

Then, as shown in FIG. 9H, a lower mask pattern 64 is formed on the conductive layer 61 of FIG. 9G, which is formed on a lower surface of the package substrate 1. Then, the conductive layer 61 may be etched by using the lower mask pattern 64 as an etching mask, and thus, as illustrated in FIG. 13, an electrode pad 65 may be formed. A plan view of the electrode pad 65 is illustrated in FIG. 13. A cross-section of the package substrate 1, which is taken along a line B-B' in FIG. 13, is shown in FIG. 9H. The electrode pad 65 of FIG. 13 corresponds to the electrode pads 23, 25 and 27 of FIG. 9H. As described above, the external electrode pad 65 may include the first through third external electrode pad 23, 25, and 27.

Figure 9I:
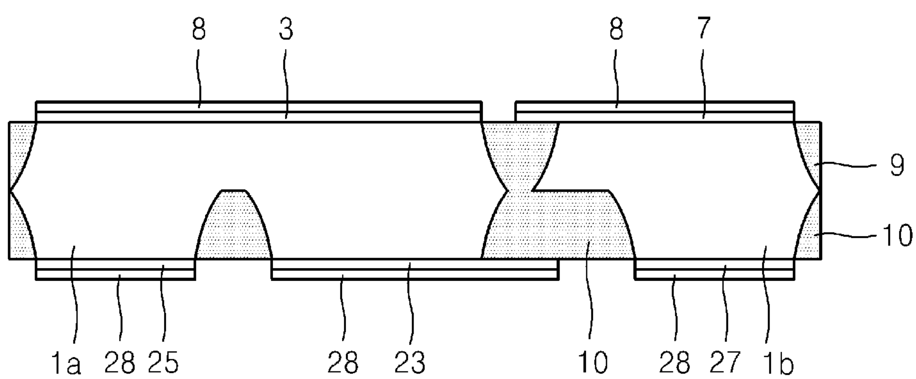

Referring to FIG. 9I, the upper mask pattern 62 and the lower mask pattern 64 may be etched and removed. Then, in order to improve electrical performance, additional conductive layers 8 and 28, which are formed of, for example, Ni or Au, may be selectively further plated on the electrode pad 63 and the external electrode pad 65. Through this process, the package substrate 1, which includes the electrode pads 3, 7, and 8 and the external electrode pads 23, 25, 27, and 28, may be obtained. Then, the LED chip 11 may be mounted in the form of a flip-chip on the electrode pads 3, 7, and 8, and thus the LED package 100 may be completed.

Figure 14:
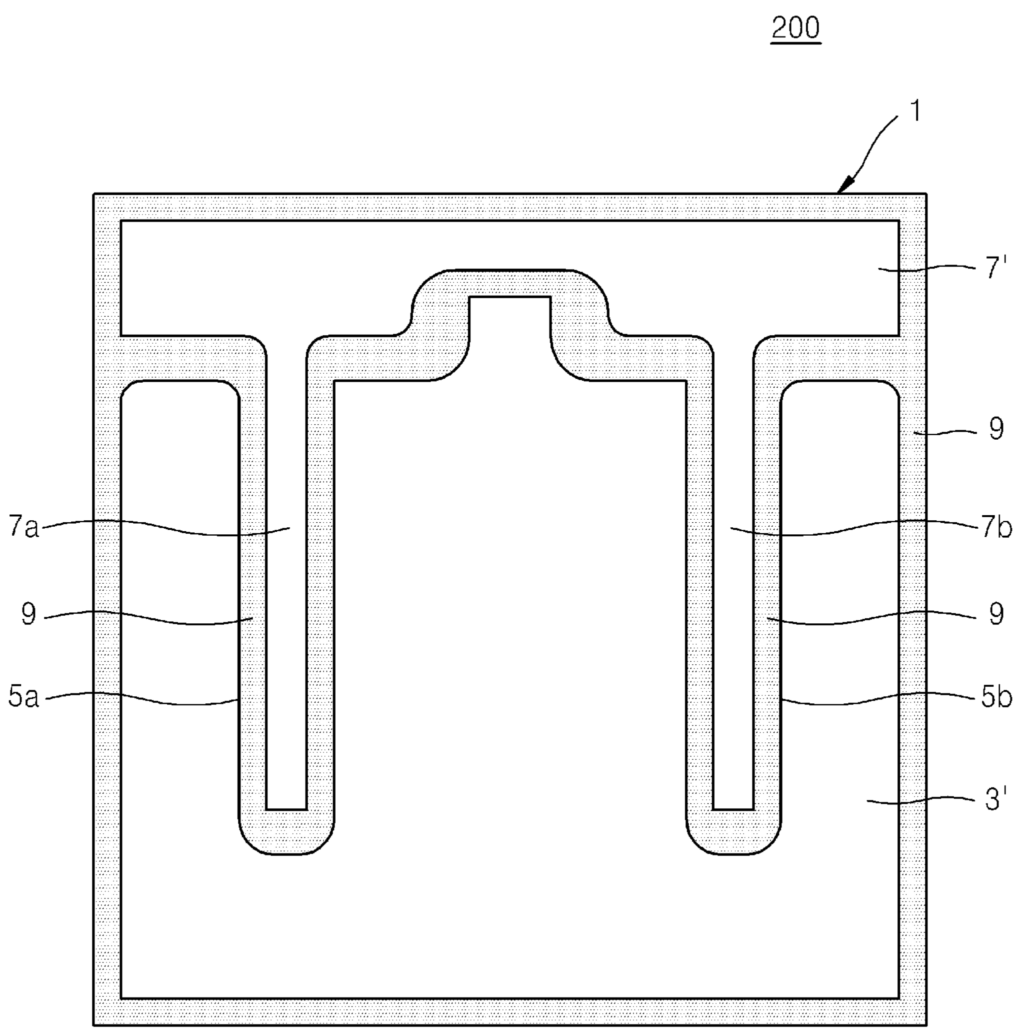
FIGS. 14 and 15 are plan views for explaining the LED package according to an embodiment of the present inventive concept.
Figure 15:
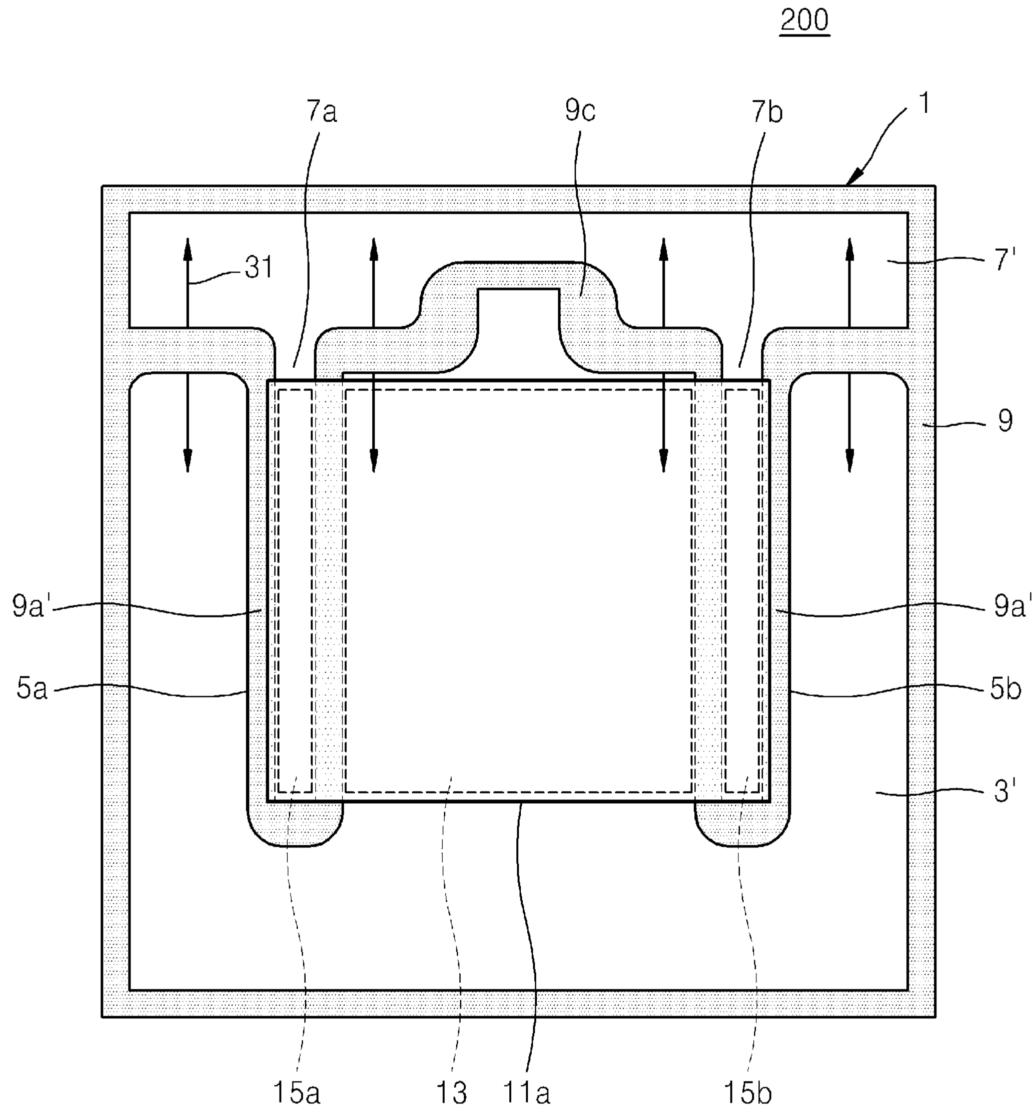

FIGS. 14 and 15 are plan views for explaining an LED package 200 according to an embodiment of the present inventive concept.

Specifically, FIG. 14 is a plan view illustrating the package substrate 1 and electrode pads 3' and 7', which are included in the LED package 200. FIG. 15 is a plan view illustrating a state in which an LED chip 11*a* is mounted on the package substrate shown in FIG. 14.

With regard to the LED package 200 that is shown in FIGS. 14 and 15, compared to the LED package 100 shown in FIGS. 1 through 4, the number of the protruding portions 7*a* and 7*b* in the second electrode pad 7' may be plural, that is, two. Accordingly, except for the fact that the number of the second electrodes 15*a* and 15*b* is plural, that is, two, the LED package 200 may be identical to the LED package 100.

As illustrated in FIGS. 14 and 15, a first electrode pad 3', which includes two groove 5*a* and 5*b*, may be disposed on the package substrate 1. The two groove 5*a* and 5*b* may be electrically insulated from the second electrode pad 7' that includes the two protruding portions 7*a* and 7*b* by an upper insulating layer 9*a'*.

Referring to FIG. 15, the LED chip 11*a* may be mounted on the package substrate 1 that includes the second electrode pad 7' and the first electrode pad 3'. The second electrode pad 7' may include the two protruding portions 7*a* and 7*b*. As illustrated in FIG. 15, with regard to the LED package 200, the second electrodes 15*a* and 15*b* in the LED chip 11*a* may be located vertically (e.g., extending in a top-bottom direction as illustrated in FIG. 15) perpendicular to an extending direction of the upper insulating layer 9*c* which is placed between the first electrode pad 3' and the second electrode pad 7'.

In the case of the LED package 200 shown in FIGS. 14 and 15, which includes such a configuration, if a size of the LED chip 11*a* is large, both of protruding portions 7*a* and 7*b* in the second electrode pad 7' may be disposed, and thus, may be applied to various designs of the LED package 200.

Figure 16:
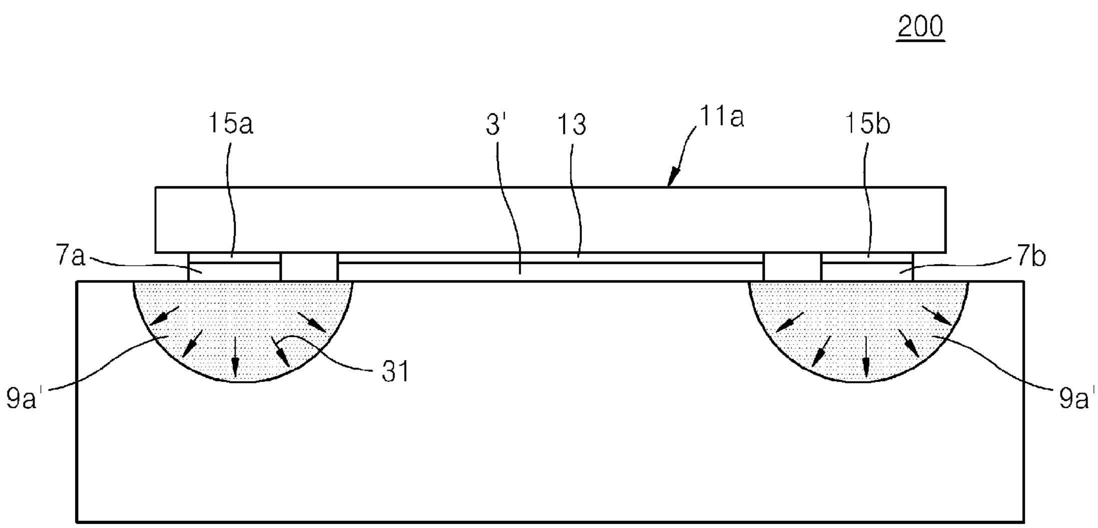
FIG. 16 is a diagram for explaining a thermal stress on an LED chip, which is caused by thermal expansion of the LED package of FIG. 15.

FIG. 16 is a diagram for explaining a thermal stress on an LED chip, which is caused by thermal expansion of the LED package of FIG. 15.

Specifically, a thermal stress on the LED package 200, shown in FIG. 16, is almost identical to a description about the LED package 100 that is shown in FIGS. 5 and 6. Thus, a description thereof will be briefly provided. As illustrated in FIG. 15, with regard to the LED package 200, the second electrodes 15*a* and 15*b*, included in the LED chip 11*a*, may be located vertically (e.g., extending in a top-bottom direction as illustrated in FIG. 15) perpendicular to an extending direction of the upper insulating layer 9 which is placed between the first electrode pad 3' and the second electrode pad 7'. Accordingly, a thermal expansion force 31 of the upper insulating layer 9, which is shown in FIGS. 15 and 16, may be applied to a short edge (having a short width or length) of the second electrodes 15*a* and 15*b*, rather than a long edge (having a long width or length) of the second electrodes 15*a* and 15*b*. Thus, a thermal stress may not be exerted on the LED chip 11*a* or may be minimally exerted on the LED chip 11.

Additionally, with regard to the LED package 200 which is shown in FIG. 16, the upper insulating layer 9 may not be connected to the lower insulating layer at a lower part of the LED chip 11*a*. Accordingly, the thermal expansion force 31 is not transmitted to the outside of the LED chip 11*a*, and thus a thermal stress may not be exerted on the LED chip 11*a* or may be minimally exerted on the LED chip 11*a*.

While the present inventive concept has been particularly shown and described with reference to exemplary embodiments thereof, it will be understood that various changes in form and details may be made therein without departing from the spirit and scope of the following claims.

What is claimed is:

1. A light-emitting diode (LED) package, comprising:
- a package substrate;
- a first electrode pad disposed on an upper surface of the package substrate and including a groove;
- a second electrode pad including a protruding portion disposed in the groove of the first electrode pad;
- an upper insulating layer for insulating the first electrode pad from the second electrode pad on the package substrate; and
- an LED chip including a first electrode and a second electrode which are respectively electrically connected in the form of a flip-chip to the first electrode pad and the protruding portion of the second electrode pad.

2. The LED package of claim 1, wherein the upper insulating layer is disposed on a surrounding portion of the package substrate.

3. The LED package of claim 1, wherein the upper insulating layer is disposed on a surrounding portion of the second electrode pad.

4. The LED package of claim 1, wherein:
- external pads and a lower insulating layer are disposed on a lower surface of the package substrate,
- the external electrode pads are electrically connected to the first electrode pad and the second electrode pad and apply an electrical signal from outside of the LED package, and
- the lower insulating layer insulates the external electrode pads.

5. The LED package of claim 1, wherein the package substrate includes metal.

6. The LED package of claim 1, wherein:
- the groove is disposed in a plural number, and
- the protruding portion is disposed in a plural number.

7. The LED package of claim 1, wherein:

the groove has a rectangular shape of which a width in one direction is greater than a width in another direction, and the protruding portion is a rod-type protruding member disposed in the rectangular groove.

8. The LED package of claim 1, wherein a size of the first electrode pad is greater than a size of the second electrode pad.

9. A light-emitting diode (LED) package, comprising:

a package substrate;

a first electrode pad and a second electrode pad that are disposed on an upper surface of the package substrate and are insulated from each other by using an upper insulating layer; and an LED chip including a first electrode and a second electrode which are respectively electrically connected in the form of a flip-chip to the first electrode pad and the second electrode pad, wherein the upper insulating layer is disposed in a lower part of the LED chip and buried inside the package substrate such that the upper insulating layer does not pass through the package substrate.

10. The LED package of claim 9, wherein the upper insulating layer is disposed on both sidewalls of the package substrate.

11. The LED package of claim 10, wherein a lower insulating layer is disposed on a lower surface of the package substrate.

12. The LED package of claim 11, wherein the upper insulating layer is connected to the lower insulating layer.

13. The LED package of claim 9, wherein a lower insulating layer is buried inside the package substrate from a lower surface of the package substrate.

14. The LED package of claim 13, wherein the lower insulating layer is connected to the upper insulating layer at a location outside the LED chip.

15. The LED package of claim 13, wherein:

an external electrode pad is disposed on the lower surface of the package substrate, such that the external electrode pad is separated by the lower insulating layer, and the external electrode pad is electrically connected to the first electrode pad and the second electrode pad to apply an electrical signal from outside of the LED chip.

16. A light-emitting diode (LED) package, comprising:

a package substrate;

a first electrode pad disposed on an upper surface of the package substrate;

a second electrode pad disposed on the upper surface of the package substrate;

an upper insulating layer for insulating the first electrode pad from the second electrode pad on the package substrate; and an LED chip including a first electrode and a second electrode which are respectively electrically connected in the form of a flip-chip to the first electrode pad and the second electrode pad, wherein:

a portion of the upper insulating layer is placed between the first electrode pad and the second electrode pad, and the second electrode extends in a direction perpendicular to an extending direction of the portion of the upper insulating layer between the first electrode pad and the second electrode pad.

17. The LED package of claim 16, wherein:

the second electrode has a rectangular shape, and a long edge of the second electrode is perpendicular to the extending direction of the portion of the upper insulating layer between the first electrode pad and the second electrode pad.

* * * * *